(12) United States Patent
Shijo (10) Patent No.: US 12,387,787 B2
(45) Date of Patent: Aug. 12, 2025

(54) QUANTUM INFORMATION STORAGE DEVICE

(71) Applicant: SEIKO EPSON CORPORATION, Tokyo (JP)

(72) Inventor: Kotaro Shijo, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 267 days.

(21) Appl. No.: 18/188,684

(22) Filed: Mar. 23, 2023

(65) Prior Publication Data

US 2023/0307046 A1 Sep. 28, 2023

(30) Foreign Application Priority Data

Mar. 25, 2022 (JP) .................................. 2022-049638

(51) Int. Cl.
G11C 7/00 (2006.01)
G11C 13/04 (2006.01)

(52) U.S. Cl.
CPC .................................. *G11C 13/048* (2013.01)

(58) Field of Classification Search
CPC .............................. G11C 13/048; G06N 10/40
USPC ......................................................... 365/215
See application file for complete search history.

(56) References Cited

U.S. PATENT DOCUMENTS

| | | | | |
|---|---|---|---|---|
| 7,532,400 B2 * | 5/2009 | Zoller | ..................... | H04B 10/70 372/89 |
| 9,531,397 B2 * | 12/2016 | Yoshida | .................. | G01N 21/63 |
| 10,133,095 B2 * | 11/2018 | Nishida | ................. | H01S 5/0078 |
| 2007/0145348 A1 | 6/2007 | Ichimura et al. | | |
| 2008/0310000 A1 | 12/2008 | Beausoleil, Jr. et al. | | |
| 2013/0176081 A1 * | 7/2013 | Nishida | ..................... | H03L 7/26 331/94.1 |
| 2021/0028865 A1 | 1/2021 | Figueroa et al. | | |
| 2021/0182096 A1 | 6/2021 | Walker et al. | | |

(Continued)

FOREIGN PATENT DOCUMENTS

| | | |
|---|---|---|
| JP | 2005331592 A | 12/2005 |
| JP | 2007178678 A | 7/2007 |
| JP | 2008507738 A | 3/2008 |

(Continued)

OTHER PUBLICATIONS

Atomic vapor quantum memory for a photonic polarization qubit.
(Continued)

*Primary Examiner* — Tha-O H Bui
(74) *Attorney, Agent, or Firm* — CHIP LAW GROUP (57) ABSTRACT

A quantum information storage device includes a first gas cell, a second gas cell, a light splitter configured to cause first light in a first state to travel along a first optical path intersecting the first gas cell and the first light in a second state to travel along a second optical path intersecting the second gas cell, a second light source configured to emit, to the first gas cell and the second gas cell, second light capable of bringing an atom into a two-photon resonance state with the first light, and a light synthesizer at a subsequent section of the first gas cell and the second gas cell, configured to synthesize third light generated when a photon included in the second light acts on the atom in the two-photon resonance state in the first gas cell and the second gas cell.

5 Claims, 4 Drawing Sheets

(56) References Cited

U.S. PATENT DOCUMENTS

2021/0183637 A1    6/2021  Makotyn et al.

FOREIGN PATENT DOCUMENTS

| | | |
|---|---|---|
| JP | 2008507739 A | 3/2008 |
| JP | 2015036781 A | 2/2015 |
| JP | 2020065201 A | 4/2020 |
| JP | 2021096851 A | 6/2021 |
| JP | 2021097043 A | 6/2021 |
| JP | 2021519444 A | 8/2021 |

OTHER PUBLICATIONS

Electromagnetically Induced Transparency in Solids.
Room-Temperature Single-photon level Memory for Polarization States.
Technical Report on Optical Properties and Technologies Single Photon Technologies.
The Knowledge base, IEICE.

\* cited by examiner

FIG. 1

[AT TIME OF STORING QUANTUM BIT]

[AT TIME OF READING QUANTUM BIT]

QUANTUM INFORMATION STORAGE DEVICE

The present application is based on, and claims priority from JP Application Serial Number 2022-049638, filed Mar. 25, 2022, the disclosure of which is hereby incorporated by reference herein in its entirety.

BACKGROUND

1. Technical Field

The present disclosure relates to a quantum information storage device.

2. Related Art

In recent years, various types of quantum information storage devices that store, in a manner of allowing reading, a quantum bit output from a quantum computer and a quantum bit transmitted in a quantum communication system have been proposed. JP-T-2021-519444 (Patent Literature 1) discloses, as a quantum information storage device, a quantum memory device including two atom vapor cells (hereinafter, referred to as "gas cells") in which an atomic vapor of rubidium or the like and a buffer gas such as krypton and neon are enclosed. In the quantum information storage device, a probe field photon beam and a control field photon beam are input together to the two gas cells to store a quantum bit.

The atoms constituting the atomic vapor hold information by, for example, quantum superposition (coherence) in a plurality of energy states, and when a control field photon beam is input for reading a quantum bit, photons in the same state as a probe field photon beam input at the time of information storage are output using the coherence as a material. The coherence is broken due to various factors, and so-called "relaxation" (decoherence) occurs. For example, the relaxation occurs due to fluctuations in resonance frequency between two energy states of atoms, exchange of energy (change in angular momentum) due to collision of atoms constituting the atomic vapor with other atoms or other elements such as an inner wall of a cell, or the like. The buffer gas has a function of preventing collision between the atoms and other elements so as not to cause such energy exchange and extending a relaxation time.

When the temperatures and pressures of the two gas cells are different from each other, the collision (interaction) rates of the atoms and other elements are different from each other, and the resonance frequencies of the atoms in the two energy states are shifted from each other. Therefore, when a control field photon beam is input thereafter, the resonance efficiencies of the two gas cells are different from each other, and a quantum bit different from a stored quantum bit is read. Therefore, in the quantum information storage device disclosed in Patent Literature 1, it is necessary to make the temperatures and pressures of the two gas cells coincide with each other accurately. Therefore, a complicated mechanism such as a heater, a heat sink, and a controller for executing a PID control loop is required, leading to an increase in the manufacturing cost and the operation cost of the quantum information storage device.

SUMMARY

According to an aspect of the present disclosure, there is provided a quantum information storage device for storing a quantum bit represented by a first state and a second state of light. The quantum information storage device includes: a first gas cell and a second gas cell in both of which an atomic vapor is enclosed; a light splitter configured to cause first light in the first state to travel along a first optical path intersecting the first gas cell and cause the first light in the second state to travel along a second optical path different from the first optical path and intersecting the second gas cell, the first light in the first state and the first light in the second state being among the first light that is emitted from a first light source and capable of exciting an atom in the atomic vapor; a second light source configured to emit, to the first gas cell and the second gas cell, second light that is capable of bringing the atom into a two-photon resonance state together with the first light; and a light synthesizer disposed at a subsequent section of the first gas cell and the second gas cell and configured to synthesize third light generated when a photon included in the second light acts on the atom in the two-photon resonance state in the first gas cell and the second gas cell. An inner wall of each of the first gas cell and the second gas cell is coated with a relaxation prevention film that prevents relaxation of quantum superposition in the two-photon resonance state.

DESCRIPTION OF EXEMPLARY EMBODIMENTS

A. Embodiment

A1. Device Configuration

Figure 1:
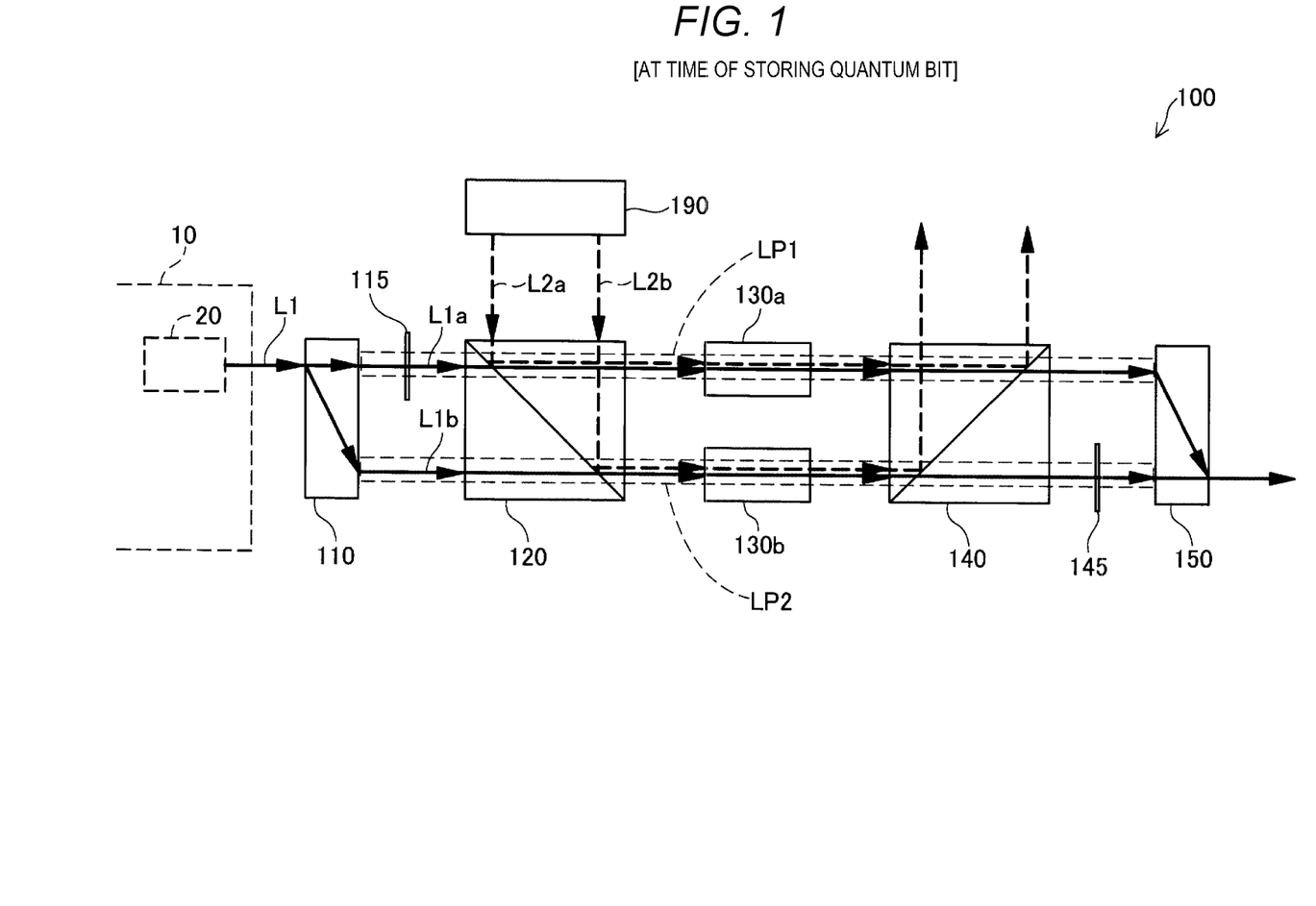
FIG. 1 is a block diagram illustrating a configuration of a quantum information storage device according to an embodiment of the present disclosure.

FIG. 1 is a block diagram illustrating a configuration of a quantum information storage device 100 according to an embodiment of the present disclosure. The quantum information storage device 100 stores a quantum bit represented by a first state and a second state of light (hereinafter, referred to as "first light L1") output from a first light source 20. The quantum information storage device 100 stores a quantum bit in a manner such that the quantum bit can be read. In FIG. 1, a flow of light at the time of storing the quantum bit is indicated by an arrow. In the embodiment, the "first state" refers to horizontal polarization, and the "second state" refers to vertical polarization. In the embodiment, the first light source 20 is provided in a quantum computer 10. The first light L1 is light indicating a result of quantum calculation in the quantum computer 10, and is pulsed light in which vertically polarized light and horizontally polarized light are mixed at a ratio corresponding to the result of the quantum calculation. The first light L1 is also referred to as "probe light".

The quantum information storage device 100 includes a first beam displacer 110, a first half-wave plate 115, a first polarizing beam splitter 120, a first gas cell 130a and a second gas cell 130b, a second polarizing beam splitter 140, a second half-wave plate 145, a second beam displacer 150, and a second light source 190. In the embodiment, when the first gas cell 130a and the second gas cell 130b are referred to without being distinguished from each other, the first gas cell 130a and the second gas cell 130b are also simply referred to as a "gas cell 130".

The first beam displacer 110 is disposed facing the first light source 20. The first beam displacer 110 divides the input first light L1 into two beams of light L1a and L1b having different states from each other. Then, the first beam displacer 110 causes the light L1a to travel along a first optical path LP1, and causes the light L1b to travel along a second optical path LP2. As illustrated in FIG. 1, the two optical paths LP1 and LP2 are spatially separated from each other and are parallel to each other. The first optical path LP1 intersects the first gas cell 130a. The second optical path LP2 intersects the second gas cell 130b. The first beam displacer 110 is also referred to as an "optical splitter". The light L1a is vertically polarized light (photon), and the light L1b is horizontally polarized light (photon).

The first half-wave plate 115 is disposed between the first beam displacer 110 and the first polarizing beam splitter 120 at a position intersecting the first optical path LP1. The light L1a passes through the first half-wave plate 115 and is accordingly converted from the vertically polarized light into the horizontally polarized light.

The first polarizing beam splitter 120 transmits horizontally polarized light and reflects vertically polarized light. As described above, since the two beams of light L1a and L1b are both horizontally polarized light beams, the two beams of light L1a and L1b transmit through the first polarizing beam splitter 120 and travel along the optical paths LP1 and LP2, respectively.

An atomic vapor is enclosed in the gas cell 130. In the embodiment, atoms constituting the atomic vapor are atoms of cesium (Cs). Details of a method for manufacturing the gas cell 130 will be described later. The first gas cell 130a is provided between the first polarizing beam splitter 120 and the second polarizing beam splitter 140 so as to intersect the first optical path LP1, and the light L1a enters the first gas cell 130a. The second gas cell 130b is provided between the first polarizing beam splitter 120 and the second polarizing beam splitter 140 so as to intersect the second optical path LP2, and the light L1b enters the second gas cell 130b.

Figure 2:
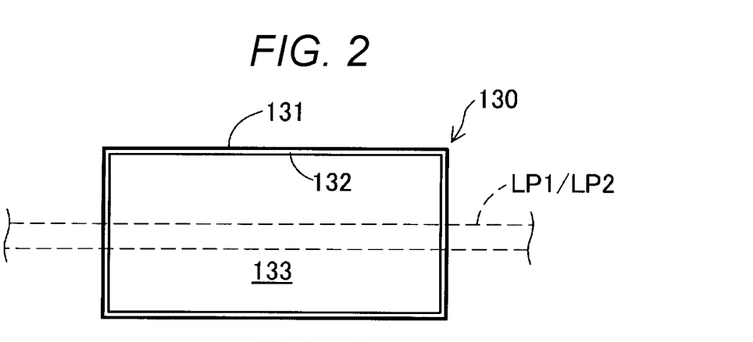
FIG. 2 is a cross-sectional view illustrating a detailed configuration of a gas cell.

FIG. 2 is a cross-sectional view illustrating a detailed configuration of the gas cell 130. The gas cell 130 has a configuration in which a cesium atom vapor is enclosed in an internal space 133 of a hollow glass cell 131 having a cylindrical external shape. In FIG. 2, a cross-sectional view taken along a central axis of the glass cell 131 is illustrated. The first optical path LP1 or the second optical path LP2 is formed in the internal space 133. An inner wall of the glass cell 131 is coated with a relaxation prevention film 132. The relaxation prevention film 132 prevents relaxation of quantum superposition of cesium atoms in a two-photon resonance state. In the embodiment, the relaxation prevention film 132 is made of paraffin. By forming the relaxation prevention film 132, the cesium atoms are prevented from directly colliding with the inner wall of the glass cell 131. Accordingly, exchange of energy (angular momentum) between the cesium atoms and the inner wall (for example, silicon atoms) of the glass cell 131 is prevented, and the progress of the relaxation of the quantum superposition caused by the exchange of energy is prevented.

As illustrated in FIG. 1, the second polarizing beam splitter 140 is disposed facing the gas cell 130. Further, the second polarizing beam splitter 140 is disposed facing the second beam displacer 150. Similarly to the first polarizing beam splitter 120, the second polarizing beam splitter 140 transmits horizontally polarized light and reflects vertically polarized light. In addition to the two beams of light L1a and L1b described above, two beams of light (hereinafter, referred to as "second light L2a and L2b") emitted from the second light source 190, reflected by the first polarizing beam splitter 120, and traveling along the two optical paths LP1 and LP2 enter the second polarizing beam splitter 140.

The second half-wave plate 145 is disposed between the second polarizing beam splitter 140 and the second beam displacer 150 at a position intersecting the second optical path LP2. The second half-wave plate 145 converts incident light (third light L3b to be described later) from horizontally polarized light to vertically polarized light.

The second beam displacer 150 is disposed at ends of the first optical path LP1 and the second optical path LP2, and synthesizes two beams of light (third light L3a and L3b to be described later) entered via the second polarizing beam splitter 140 and the second half-wave plate 145 into one beam of light (fourth light L4 to be described later). The second beam displacer 150 is also referred to as a "light synthesizer".

The second light source 190 emits two beams of the second light L2a and L2b having the same frequency. The second light source 190 is disposed facing the first polarizing beam splitter 120. The two beams of the second light L2a and L2b are vertically polarized pulsed light. Accordingly, the two beams of the second light L2a and L2b are reflected by the first polarizing beam splitter 120 and enter the gas cell 130. Therefore, it can be said that the second light source 190 emits the two beams of the second light L2a and L2b to the gas cell 130. The second light L2a is reflected by the first polarizing beam splitter 120 and then travels along the first optical path LP1 to enter the first gas cell 130a. The second light L2b is reflected by the first polarizing beam splitter 120 and then travels along the second optical path LP2 to enter the second gas cell 130b. In the embodiment, when the second light L2a and the second light L2b are referred to without being distinguished from each other, the second light L2a and the second light L2b are simply referred to as "second light L2". The second light L2 is light capable of bringing the cesium atoms in the gas cell 130 into a two-photon resonance state together with the first light L1 (the light L1a and the light L1b). The reason why the second light L2 is pulsed light and is not continuous light is to avoid an occurrence that, immediately after a quantum bit is stored, the second light L2 enters the gas cell 130 and the quantum bit is read out due to loss of coherence.

Figure 3:
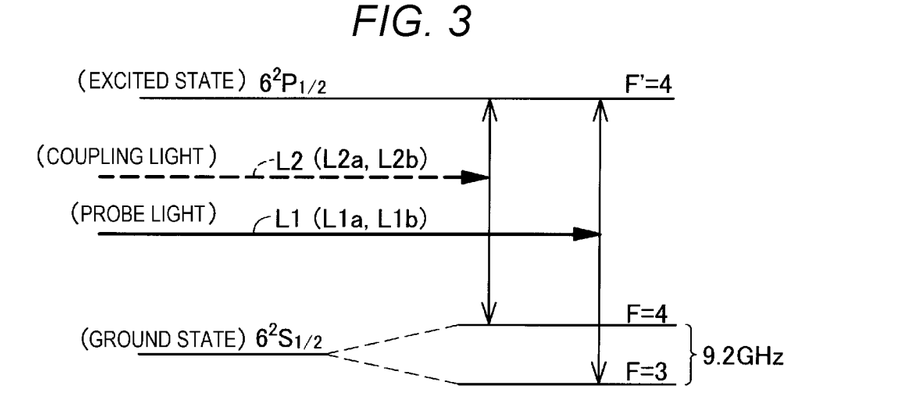
FIG. 3 is an illustrative diagram for illustrating a two-photon resonance state of a cesium atom.

FIG. 3 is an illustrative diagram for illustrating a two-photon resonance state of the cesium atom. In FIG. 3, an energy structure of the cesium atom, the incident first light L1 (light L1a and light L1b), and the second light L2 (second light L2a and second light L2b) are illustrated.

An energy level of the cesium atom is a so-called Λ-type three-level system having two ground states $6^2S_{1/2}$ (F=3, F=4) and an excited state $6^2P_{1/2}$ (F'=4). Although each ground state and each excited state have a finer energy structure, the finer energy structures thereof are omitted in FIG. 3. A frequency of an electromagnetic wave required for transition between the ground state (F=3) and the ground state (F=4) is about 9.2 GHz. The first light L1 (light L1a, L2a) is light that resonates with an energy level difference between the ground state (F=3) and the excited state (F'=4). The second light L2 (second light L2a and L2b) is light that resonates with an energy level difference between the ground state (F=4) and the excited state (F'=4). When these two types of light (the first light L1 and the second light L2) are incident on a certain cesium atom, the state of the cesium atom is not fixed to any one of the two ground states (F=3 and F=4), and quantum superposition in which the respective ground states are superposed, that is, a two-photon resonance state is obtained. In such a two-photon resonance state, coherence is achieved. This coherence is a relatively long-lived coherence generated between the two ground states (F=3 and F=4), and is also referred to as "sublevel coherence". When the second light L2, which is coupling light, is incident on atoms retaining the sublevel coherence, probe light (third light L3 described later) is emitted due to interaction between the coherence of the cesium atoms and the coupling light. The probe light emitted at this time has the same mode (frequency and polarization) as the first light L1 that is probe light incident when the two-photon resonance state is established. Therefore, the gas cell 130 stores a quantum bit represented by the first light L1 and then outputs (reads) the quantum bit.

A2. Manufacturing of Gas Cell 130

Figure 4:
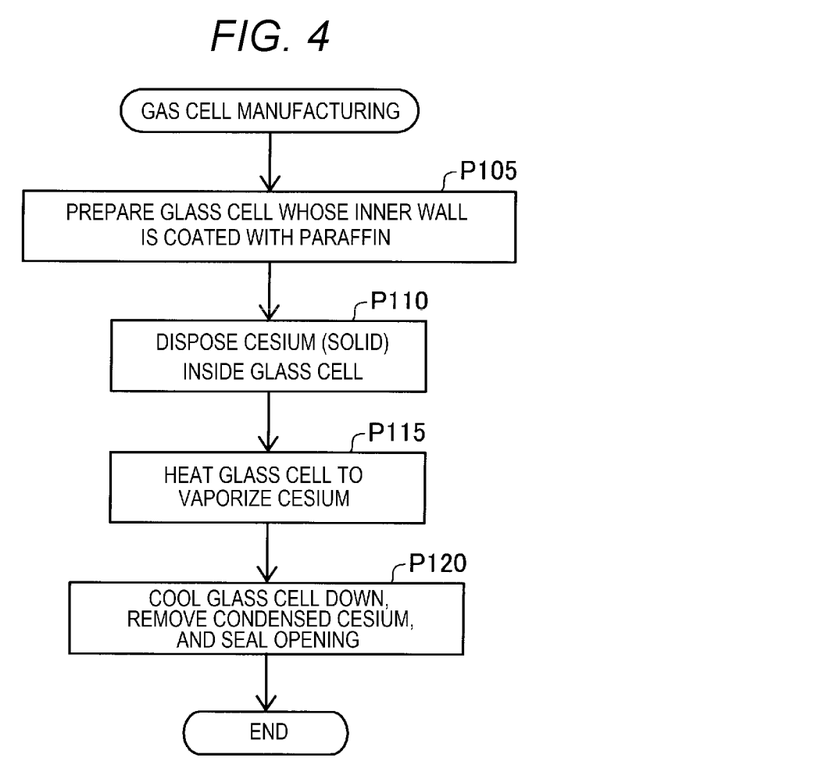
FIG. 4 is a flowchart illustrating a manufacturing procedure of a gas cell.

FIG. 4 is a process flowchart illustrating a manufacturing procedure of the gas cell 130. First, the glass cell 131 whose inner wall is coated with paraffin equivalent to the relaxation prevention film 132 is prepared (process P105). The glass cell 131 prepared at this time is provided with an opening through which the internal space 133 can be accessed.

Solid cesium is disposed in the glass cell 131 (in the internal space 133) process P110). The glass cell 131 is heated to vaporize the cesium disposed in the internal space 133 (process P115).

The glass cell 131 is cooled, a portion of the cesium condensed in the glass cell 131 due to the cooling is removed, and the opening portion of the glass cell 131 is sealed (process P120). Accordingly, the gas cell 130 is completed.

Note that no buffer gas is enclosed in the internal space 133 of the gas cell 130 according to the embodiment. The "buffer gas" is a gas for preventing cesium atoms constituting the atomic vapor from colliding with the glass cell 131. As described above, since the relaxation prevention film 132 is formed on the inner wall of the glass cell 131, relaxation of coherence (sublevel coherence) due to collision of the cesium atoms with a surface of the inner wall can be prevented even when the buffer gas is not enclosed. Accordingly, no buffer gas is enclosed. In the embodiment, "no buffer gas being enclosed" means a broad concept including not only a case where the buffer gas is 0 (zero) Torr as a partial pressure in the internal space 133 of the glass cell 131 but also a case where the buffer gas is less than 40 Torr as a partial pressure in the internal space 133 of the glass cell 131. A relaxation time (coherence retention time) of a quantum superposition state in a case where the buffer gas is 40 Torr is about 5 ms (milliseconds), which is equal to a relaxation time in a case where the relaxation prevention film 132 made of paraffin is formed. That is, a case where a buffer gas having a pressure, at which a relaxation time shorter than the relaxation time achieved with the relaxation prevention film 132 can be achieved, is enclosed is also equivalent to "no buffer gas being enclosed" in the embodiment.

A3. Storage and Reading of Quantum Bit

As illustrated in FIG. 1, as described above, when the first light L1 (light L1a and light L1b) and the second light L2 (second light L2a and light L2b) both enter each gas cell 130, a two-photon resonance state is generated in each gas cell 130, and a quantum bit represented by the first light L1 (light L1a and light L1b) is stored. As illustrated in FIG. 1, though the first light L1 (light L1a and light L1b) transmitted through the gas cell 130 is output to the outside of the quantum information storage device 100 via the second polarizing beam splitter 140, the second half-wave plate 145, and the second beam displacer 150, the light output is not utilized in this time.

Figure 5:
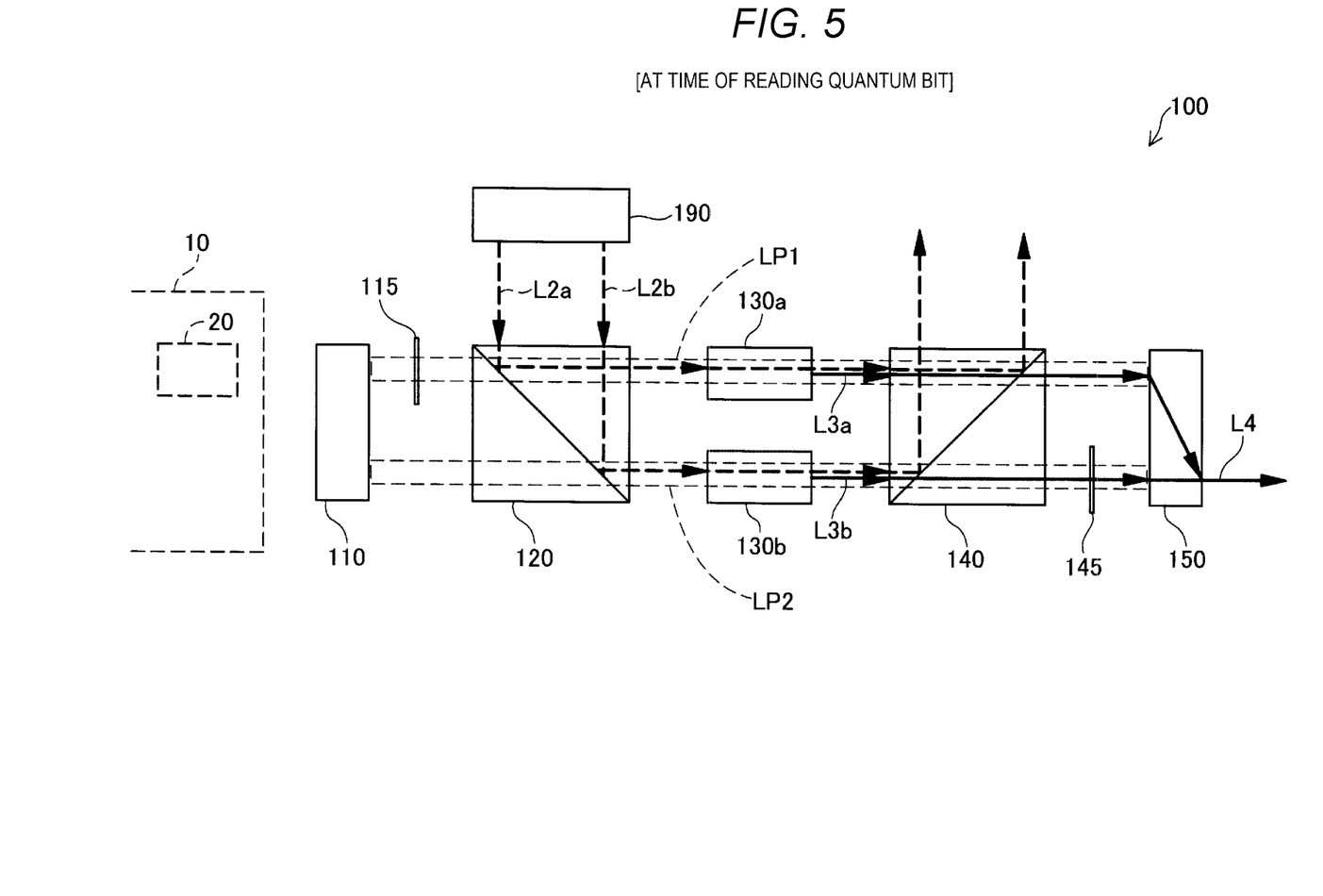
FIG. 5 is an illustrative diagram illustrating a flow of light at the time of quantum bit reading.

FIG. 5 is an illustrative diagram illustrating a flow of light at the time of quantum bit reading. In FIG. 5, with respect to the same block diagram of the quantum information storage device 100 as in FIG. 1, a flow of light at the time of reading a quantum bit is indicated by an arrow. In the embodiment, when reading a quantum bit from the quantum information storage device 100, the first light L1 does not enter the quantum information storage device 100 from the first light source 20.

With the two-photon resonance state in the two gas cells 130, the second light L2 (second light L2a and L2b) is emitted from the second light source 190. The second light L2 is reflected by the first polarizing beam splitter 120 and enters each gas cell 130.

As described with reference to FIG. 3, when the second light L2a, which is the coupling light, enters the first gas cell 130a, the probe light is emitted. Specifically, the third light L3a is emitted from the first gas cell 130a, and the third light L3b is emitted from the second gas cell 130b. The third light L3a transmits through the second polarizing beam splitter 140 and enters the second beam displacer 150. On the other hand, the third light L3b transmits through the second half-wave plate 145 after transmitting through the second polarizing beam splitter 140. Therefore, the third light L3b transmitted through the second half-wave plate 145 and entering the second beam displacer 150 is converted from the horizontally polarized light into the vertically polarized light. The second beam displacer 150 synthesizes the third light L3a, which is horizontally polarized light transmitted through the second polarizing beam splitter 140, and the third light L3b, which is vertically polarized light transmitted through the second half-wave plate 145, and emits the fourth light L4. In the embodiment, the quantum bit is represented by a ratio between horizontal polarization and vertical polarization, in other words, a ratio between the number of horizontally polarized photons and the number of vertically polarized photons, or a ratio between a probability of horizontal polarization and a probability of vertical polarization in a case where there is a single photon. A ratio between the light L1a and the light L1b is equal to a ratio between the third light L3a and the third light L3b output from the gas cell 130. Therefore, the fourth light L4 represents the same quantum bit as the first light L1.

According to the quantum information storage device 100 of the embodiment described above, inner walls of the first gas cell 130a and the second gas cell 130b are both coated with the relaxation prevention film 132 that prevents relaxation of the quantum superposition state, and thus relaxation of the quantum superposition in the case where the cesium atoms constituting the atomic vapor collide with the inner walls of the first gas cell 130a and the second gas cell 130b can be prevented. Therefore, it is not necessary to enclose a buffer gas in the first gas cell 130a and the second gas cell 130b in order to prevent such relaxation. Therefore, since a complicated configuration for making the temperatures and the pressures of the two gas cells 130a and 130b coincide with each other is not required, it is possible to prevent an increase in the manufacturing cost and the operation cost of the quantum information storage device 100 while preventing the relaxation of the quantum superposition.

In addition, since the relaxation prevention film 132 is made of paraffin, a film having a structure in which molecules are densely arranged can be formed as the relaxation prevention film 132, and the relaxation of the quantum superposition can be more reliably prevented.

B. Other Embodiments (B1) Although the "first state" refers to horizontal polarization, and the "second state" refers to vertical polarization in the above embodiment, the present disclosure is not limited thereto. First linear polarization at any angle other than the horizontal or vertical angle may be set to the "first state", and second linear polarization orthogonal to the first linear polarization may be set to the "second state". Also in such a configuration, since the first state is the first linear polarization and the second state is the second linear polarization orthogonal to the first linear polarization, these polarization states can be stored and read as quantum bits. In addition, not limited to linear polarization, circular polarization may be set to the first state and the second state. Specifically, first circular polarization may be set to the "first state", and second circular polarization in a reversed direction to the first circular polarization may be set to the "second state". Also in such a configuration, since the first state is the first circular polarization and the second state is the second circular polarization in the reversed direction to the first circular polarization, these polarization states can be stored and read as quantum bits.

(B2) Although the first light source 20 is provided in the quantum computer 10 and the first light L1 is light indicating a quantum calculation result in the quantum computer 10 in the above embodiment, the present disclosure is not limited thereto. The first light L1 may be light indicating information transmitted in a quantum communication system, and the first light source 20 may be a device for outputting or relaying the light.

(B3) Although the atomic vapor enclosed in the gas cell 130 is constituted by cesium atoms in the above embodiment, the present disclosure is not limited thereto. Any other kind of alkali metal may be used. The alkali metal has a relatively simple energy level, and a ground state and an excited state thereof can be clearly distinguished from each other. Therefore, there is an advantage that it is easy to generate light having a resonance wavelength between levels that are targets. The atom is not limited to that of an alkali metal, and may be any atom having a Λ-type three-level system. Further, not limited to the Λ type, an atom having any other three-level system of a V type, a cascade type or the like may be used.

(B4) Although the relaxation prevention film 132 is made of paraffin in the above embodiment, the relaxation prevention film 132 is not limited to paraffin, and may be made of any material capable of reducing the interaction with the atoms in the two-photon resonance state as compared with a configuration without the relaxation prevention film 132, such as any material having organic molecules.

(B5) The quantum information storage device 100 according to the above embodiment is merely an example, and various modifications can be made thereto. For example, although the glass cell 131 has a cylindrical external shape, the glass cell 131 may have any external shape such as a cube, a rectangular parallelepiped, or a sphere. The first polarizing beam splitter 120, the second polarizing beam splitter 140, the first half-wave plate 115, and the second half-wave plate 145 may be not provided. In such a configuration, the second light source 190 may be disposed such that the two beams of the second light L2a and L2b emitted from the second light source 190 directly enter the first gas cell 130a and the second gas cell 130b, respectively. In such a configuration as well, a two-photon resonance state is established in an atom on which both the first light L1 and the second light L2 are incident, and a quantum bit can be stored. In such a configuration, a MEMS mirror may be used to control the optical paths of the first light L1 and the second light L2.

The present disclosure is not limited to the above embodiments, and can be implemented in various forms without departing from the spirit of the present disclosure. For example, the present disclosure can be implemented in the following aspects. In order to solve a part of or all of problems of the present disclosure, or in order to achieve a part of or all of effects of the present disclosure, technical features of the above embodiments corresponding to technical features in the following aspects can be replaced or combined as appropriate. Any of the technical features may be omitted as appropriate unless the technical feature is described as essential in the present description.

C. Other Aspects (1) According to an aspect of the present disclosure, there is provided a quantum information storage device configured to store a quantum bit represented by a first state and a second state of light. The quantum information storage device includes: a first gas cell and a second gas cell in both of which an atomic vapor is enclosed; a light splitter configured to cause first light in the first state to travel along a first optical path intersecting the first gas cell and cause the first light in the second state to travel along a second optical path different from the first optical path and intersecting the second gas cell, the first light in the first state and the first light in the second state being among the first light that is emitted from a first light source and capable of exciting an atom in the atomic vapor; a second light source configured to emit, to the first gas cell and the second gas cell, second light that is capable of bringing the atom into a two-photon resonance state together with the first light; and a light synthesizer disposed at a subsequent section of the first gas cell and the second gas cell and configured to synthesize third light generated when a photon included in the second light acts on the atom in the two-photon resonance state in the first gas cell and the second gas cell. An inner wall of each of the first gas cell and the second gas cell is coated with a relaxation prevention film that prevents relaxation of quantum superposition in the two-photon resonance state.

According to the quantum information storage device of this aspect, since the inner walls of the first gas cell and the second gas cell are coated with the relaxation prevention film that prevents relaxation of a quantum superposition state, relaxation of the quantum superposition in a case where atoms constituting the atomic vapor collide with the inner walls of the first gas cell and the second gas cell can be prevented. Therefore, it is not necessary to enclose a buffer gas in the first gas cell and the second gas cell in order to prevent such relaxation. Accordingly, since a complicated configuration for making temperatures and pressures of the two gas cells coincide with each other is not required, it is possible to prevent an increase in the manufacturing cost and the operation cost of the quantum information storage device while preventing the relaxation of the quantum superposition.

(2) In the quantum information storage device according to the above aspect, the first state may be first linear polarization, and the second state may be second linear polarization orthogonal to the first linear polarization.

According to the quantum information storage device of this aspect, since the first state is the first linear polarization and the second state is the second linear polarization orthogonal to the first linear polarization, these polarization states can be stored and read as quantum bits.

(3) In the quantum information storage device according to the above aspect, the first state may be first circular polarization, and the second state may be second circular polarization in a reversed direction to the first circular polarization.

According to the quantum information storage device of this aspect, since the first state is the first circular polarization and the second state is the second circular polarization in the reversed direction to the first circular polarization, these polarization states can be stored and read as quantum bits.

(4) In the quantum information storage device according to the above aspect, the relaxation prevention film may include paraffin.

According to the quantum information storage device of this aspect, since the relaxation prevention film includes paraffin, a film having a structure in which molecules are densely arranged can be formed as the relaxation prevention film, and the relaxation of the quantum superposition can be more reliably prevented.

What is claimed is:

1. A quantum information storage device for storing a quantum bit represented by a first state and a second state of light, the quantum information storage device comprising:
   a first gas cell in which an atomic vapor is enclosed;
   a second gas cell in which the atomic vapor is enclosed;
   a light splitter configured to cause first light in the first state to travel along a first optical path intersecting the first gas cell and cause the first light in the second state to travel along a second optical path different from the first optical path and intersecting the second gas cell, the first light in the first state and the first light in the second state being among the first light that is emitted from a first light source and capable of exciting an atom in the atomic vapor;
   a second light source configured to emit, to the first gas cell and the second gas cell, second light that is capable of bringing the atom into a two-photon resonance state together with the first light; and
   a light synthesizer disposed at a subsequent section of the first gas cell and the second gas cell and configured to synthesize third light generated when a photon included in the second light act on the atom in the two-photon resonance state in the first gas cell and the second gas cell, wherein
   an inner wall of each of the first gas cell and the second gas cell is coated with a relaxation prevention film that prevents relaxation of quantum superposition in the two-photon resonance state.

2. The quantum information storage device according to claim 1, wherein
   the first state is first linear polarization, and the second state is second linear polarization orthogonal to the first linear polarization.

3. The quantum information storage device according to claim 1, wherein
   the first state is first circular polarization, and the second state is second circular polarization in a reversed direction to the first circular polarization.

4. The quantum information storage device according to claim 1, wherein
   the relaxation prevention film includes paraffin.

5. The quantum information storage device according to claim 2, wherein
   the relaxation prevention film includes paraffin.

* * * * *